United States Patent [19]

Sitch

[11] Patent Number: 4,663,543

[45] Date of Patent: May 5, 1987

[54] VOLTAGE LEVEL SHIFTING DEPLETION MODE FET LOGICAL CIRCUIT

[75] Inventor: John E. Sitch, Ottawa, Canada

[73] Assignee: Northern Telecom Limited, Montreal, Canada

[21] Appl. No.: 777,643

[22] Filed: Sep. 19, 1985

[51] Int. Cl.[4] ............................................ H03K 19/017
[52] U.S. Cl. .................................... 307/450; 307/443; 307/448; 307/481; 307/246
[58] Field of Search ............... 307/443, 448, 450, 480, 307/481–482, 246, 269

[56] References Cited

U.S. PATENT DOCUMENTS

| | | | |
|---|---|---|---|
| 3,845,324 | 10/1974 | Feucht | 307/482 X |
| 4,558,235 | 12/1985 | White et al. | 307/443 X |
| 4,574,209 | 3/1986 | Lade et al. | 307/584 X |

FOREIGN PATENT DOCUMENTS

| | | | |
|---|---|---|---|
| 0019033 | 2/1983 | Japan | 307/450 |
| 0023628 | 2/1984 | Japan | 307/450 |

OTHER PUBLICATIONS

Mead and Conway, Introduction to VLSI Systems, Addison-Wesley Pub. Co., Reading, Mass., Oct. 1980, pp. 17–18.

Zuleeg et al., "Femtojoule High-Speed Planar GaAs E–JFET Logic", IEEE T.E.D., vol. ED-25, No. 6, Jun. 1978, pp. 626–639.

Furman et al., "Inverter Driver with Improved Performance", IBM TDB, vol. 23, No. 8, Jan. 1981, p. 3612.

Primary Examiner—Stanley D. Miller
Assistant Examiner—D. R. Hudspeth
Attorney, Agent, or Firm—John E. Mowle; Stuart L. Wilkinson

[57] ABSTRACT

A GaAs D-MESFET logic system having a low power delay product has a switching second and a voltage level shifting section. The voltage level shifting section consists of a chain of diodes and a pulldown transistor. The switching section consists of an array of D-MESFETs which acts to speed up operation of a coupling capacitor. The low power dissipation of known capacitor coupled D-MESFET logic is thus preserved, while reducing gate delay.

6 Claims, 4 Drawing Figures

VOLTAGE LEVEL SHIFTING DEPLETION MODE FET LOGICAL CIRCUIT

This invention relates to a FET logic system particularly adapted for GaAs depletion-mode MESFET digital integrated circuits.

The basic structure of a D-MESFET implemented for example in GaAs has a thin n-type active region joining two ohmic contacts separated by about 4 microns, with a 1 micron metal Schottky barrier gate separating the source and drain. In operation, the conducting n-channel is confined between the gate depletion region and the semi-insulating GaAs substrate.

A primary problem of depletion-mode MESFET GaAs integrated circuit design has been in realizing a voltage level shifting function required between the positive drain voltage required for operation of n-channel D-MESFETs and the negative gate voltages required to turn off subsequent D-MESFETs. Although using directly-coupled FET logic (DCFL), enhancement-mode MESFET gate inputs can be connected directly to the drain outputs, enhancement-mode FETs available in GaAs are troubled with serious manufacturing problems. While the ready manufacturability and higher speeds of D-MESFET GaAs integrated circuits make them attractive, known D-MESFET logic systems do not approach the efficiency of the DCFL logic system and realization of the voltage shifting function has led to serious compromises in performance and/or power efficiency.

There are several known D-MESFET logic systems: buffered FET logic (BFL), unbuffered FET logic (UFL) and capacitor FET logic (CFL). All use a chain of forward biased diodes and a pulldown FET to shift the voltage level down so that the low state is sufficiently negative to switch off the driver section of a following logic element.

In UFL, the driver section has an input D-MESFET with source connected to a low reference voltage and drain connected to the source of a load D-MESFET. The load D-MESFET gate and source are interconnected and the drain is connected to a positive reference voltage. An output from the load device is taken directly to the chain of level shifting diodes.

In BFL, the output of the load D-MESFET is applied to the gate of a buffer D-MESFET having its drain connected to the positive reference voltage and source connected to the chain of level shifting diodes.

CFL also uses a pulldown FET and a series of level shifting diodes but in this case both the FET and the diodes are very small. The diodes maintain a constant voltage across a coupling capacitor connected in parallel with the chain of diodes, the capacitor usually implemented in GaAs MESFET circuits as a reverse biased Schottky diode. Capacitively coupled logic gates are very fast and yet use far less power than non-capacitively coupled systems. Being unbuffered, CFL has a relatively high output impedance and a modification of CFL, termed bootstrapped CFL, is known in which a further small D-MESFET is connected between the high voltage rail and the gate of the load D-MESFET. A modification of CFL logic is now proposed. The modification is termed super capacitor FET logic (SCFL) and offers a low power delay product.

According to one aspect of the invention, there is provided a logic cell using depletion-mode FETs, the cell having a driver section, a voltage level shifting section series connected to the driver section, and a coupling capacitor, the driver section implemented as an array of D-FETs and having a switching section and a timing section, the switching section operable in response to a logic input level to give a corresponding logic output level, the timing section operable during the period of a logic swing in a first direction to cause current to flow from the coupling capacitor to a low reference voltage point, and operable during the period of a logic swing in the opposite direction to cause current to flow from a high reference voltage point to the coupling capacitor.

The switching section can comprise a pair of D-FETs series connected between the high reference voltage point and the low reference voltage point, the driver section output being taken from between the two D-FETs. The timing section can comprise a further pair of D-FETs series connected between high and low reference voltage points, the logic input being applied commonly to gates of those D-FETs connected to the low reference voltage, the gates of the D-FETs connected to the high reference voltage point being connected to the source of that timing section D-FET connected to the high reference voltage point.

The dimensions and load conditions of the D-FETs are chosen so that the D-FETs within the timing section switch faster than the D-FETs within the switching section. The D-FETs connected to the low reference voltage point can comprise a single split-gate device. Similarly, the D-FETs connected to the high reference voltage point can comprise a single split-gate device. The logic system is preferably implemented on a GaAs substrate.

The level shifting section can comprise a series of level shifting diodes connected to a pulldown transistor. The level shifting section can follow or proceed the driver section. The coupling capacitor is preferably implemented as a reverse biased Schottky diode.

In an alternative bootstrapped configuration of the driver section, the timing section D-FET connected to the high reference voltage point has its source connected to the switching section D-FET connected to the higher reference voltage point and has its gate connected to the source and gate of a further D-FET, the further D-FET having its drain connected to the high reference voltage point.

The logic system can be used in the implementation of NOR and NAND gates and combinations thereof.

A two-input NOR gate can resemble the single input logic cell hereinbefore defined, but in which each of the input D-FETs in the timing and switching sections is replaced by a pair of parallel connected input D-FETs. Similarly a two-input NAND gate can resemble said single input logic cell except that each of the input D-FETs in the timing and switching sections are replaced by a pair of series connected input D-FETs.

Embodiments of the invention will now be described by way of example, with reference to the accompanying drawings in which.

Figure 1:
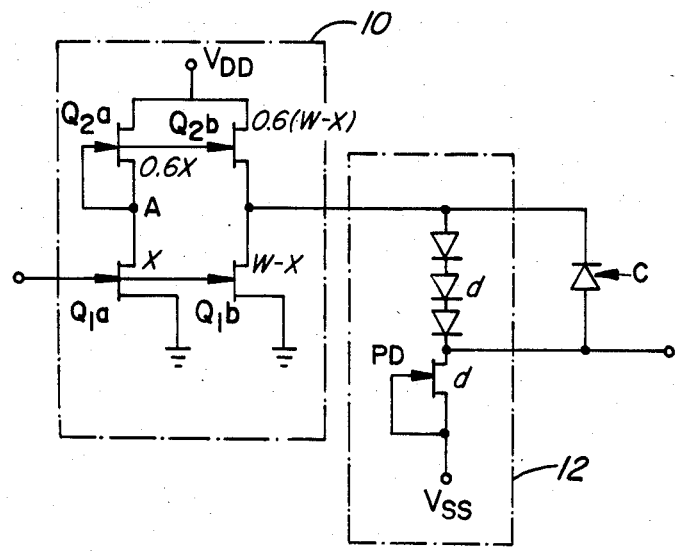
FIG. 1 is a circuit schematic diagram of a super capacitor D-MESFET logic (SCFL) cell according to the invention.

Referring to FIG. 1 in detail, there is illustrated a GaAs super capacitor FET logic (SCFL) cell having a driver section 10, a voltage level shifting section 12 and a coupling capacitor C. The driver section utilizes depletion mode MESFETs thoughout. Depletion mode MESFETs require a negative gate voltage of about −1.5 volts in order to switch off whereas their operation requires a positive drain voltage. The voltage level shifting section 12 is utilized to lower the output voltage to a level at which a subsequent SCFL element can be switched off.

The driver section has a switching section consisting of D-MESFETs $Q_{1b}$ and $Q_{2b}$ and a timing section consisting of MESFETs $Q_{1a}$ and $Q_{2a}$, the switching and timing sections connected between upper and lower reference voltages, respectively, $V_{DD}$ and GROUND. The MESFET pair $Q_{1a}$ and $Q_{1b}$ consists of a split-gate transistor having a common ground, and the MESFET pair $Q_{2a}$ and $Q_{2b}$ consists of a split-gate transistor having a common drain connected to voltage rail $V_{DD}$. Owing to the dimensions and load conditions, MESFETs $Q_{1a}$ and $Q_{2a}$ switch faster than $Q_{1b}$ and $Q_{2b}$.

MESFET $Q_{2a}$ has its source connected to its gate and is connected to MESFET $Q_{2b}$ in a source follower configuration. A logic input is applied to the gate of MESFET $Q_{1a}$ and a corresponding logic output is taken from between $Q_{1b}$ and $Q_{2b}$.

At the voltage level shifting section, the output of the switching section is taken through a chain of level shifting Schottky diodes to a pulldown D-MESFET PD connected to a low voltage rail $V_{SS}$. The logic cell output is taken from the low voltage end of the level shifting diodes, the diodes being connected in parallel with the coupling capacitor element C which is implemented as a reverse biased Schottky diode.

Typically, the relative areas of the "b" MESFETs have a gate width three times that of the corresponding "a" MESFETs. The width "d" of the level shifting diodes and the pulldown transistor PD are the minimum values permitted by current fabrication technology being of the order of 2 microns.

In the basic operation of the driver section, when a logic high is applied to $Q_1$, $Q_1$ turns on, node A goes low and $Q_2$ switches off. Conversely when a logic low is applied to $Q_1$, $Q_1$ is switched off, node A goes high, and $Q_2$ switches on. The speed of the output logic swing depends on the load which includes the coupling capacitor C. By dividing the driver section into a timing section and a switching section, the speed of coupling of the coupling capacitor is increased.

As previously indicated, each pair of MESFETs (i.e. the "a"s and "b"s) works as a switch, the dimensions of the devices and their relative loadings being such that the "a" MESFETs switch faster than the "b" MESFETs. Thus, since $Q_{1a}$ and $Q_{2a}$ switch faster than $Q_{1b}$ and $Q_{2b}$, the gate of $Q_{2b}$ is pulled down below the potential of the $Q_{2b}$ source and the current through $Q_{2b}$ is less than it would be if the gate of $Q_{2b}$ were shorted to the source as in $Q_{2a}$. Consequently a greater portion of the $Q_{1b}$ drain current is available to remove charge from the top plate of the capacitor C and thus from the load. Conversely when the output is rising, the gate of $Q_{2b}$ is forward biased relative to its source so causing current to flow from $V_{DD}$ to the capacitor C and the load. In each case after a short interval, the gate and source of $Q_{2b}$ reach the same potential. Typically in GaAs MESFET logic $V_{DD}$ is +3 volts and $V_{SS}$ is −3 volts. The logic HIGH output of the driver section is about 3 volts which is level shifted by the diode chain to about 0.7 volts. In the logic LOW condition the output of the driver section is about 0.5 volts which is level shifted down to about −1.5 volts.

For applications where the fanout is low, the power delay product of SCFL is one fifth that of buffered FET logic (BFL). Under any fanout circumstances, the power delay product does not exceed thirty percent of the BFL power delay product.

Figure 2:
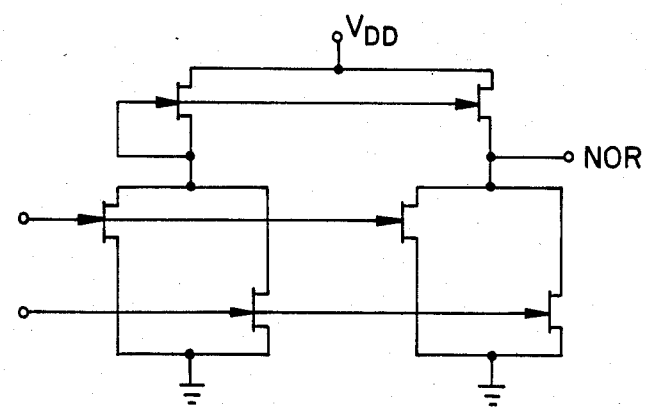
FIG. 2 is a circuit schematic diagram of a switching section of a NOR gate using the SCFL logic.
Figure 3:
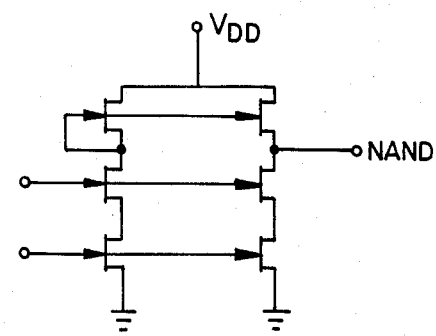
FIG. 3 is a circuit schematic view of a switching section of a NAND gate using the SCFL logic.

Referring to FIGS. 2 and 3 the split channel driver $Q_{1a}$, $Q_{1b}$ may be replaced by two or more parallel-connected split gate MESFETs to realize a NOR function (FIG. 2) or there may be multiple gates giving a NAND function (FIG. 3). A combination NAND/NOR arrangement may be realized with multiple gate FETs in Parallel (not shown).

Figure 4:
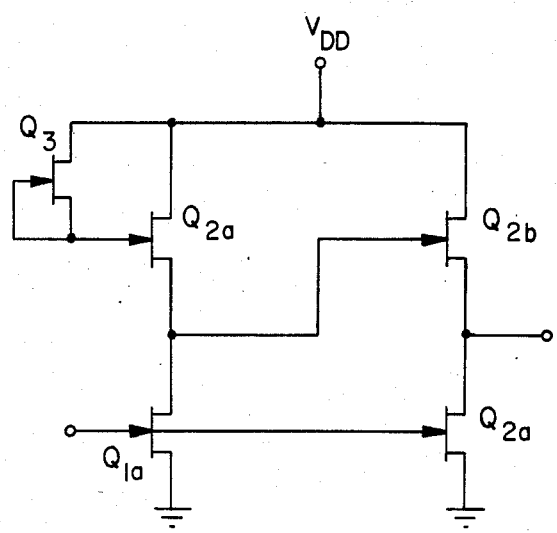
FIG. 4 is a circuit schematic drawing showing a modification of the super capacitor FET logic cell of FIG. 1.

Referring to FIG. 4, in a modification of the super capacitor FET driver section of FIG. 1, a bootstrapped version is shown. In the FIG. 4 embodiment, the gate of $Q_{2a}$ is connected to the source of a further minimum size D-FET $Q_3$. The drain of $Q_3$ is connected to $V_{DD}$ and its gate is connected to its source. When the input to $Q_{1a}$ is low, the drain of $Q_{1a}$ is at a high potential and no current flows through $Q_{2a}$ or through $Q_3$. Then when the input to $Q_{1a}$ goes high, current is drawn through $Q_{2a}$ and the potential of $Q_{2a}$ source starts to fall. Because of the capacitance between $Q_{2a}$ source and gate, $Q_{2a}$ gate potential also falls. Although $Q_{2a}$ gate-source capacitance is charged through $Q_3$ this is comparatively slow. The current available from the source of $Q_{2a}$ is thus $I_{DSS}$ i.e. the $I_{DS}$ with source and gate of $Q_{2a}$ short circuited. When $Q_{1a}$ drain is high or going down, the voltage on the source of $Q_{2a}$ equals the voltage on the gate of $Q_{2a}$. When $Q_{1a}$ drain is at a low or rising potential, current through $Q_3$ flows through $Q_{2a}$ gate, thereby forward biasing it and so increasing $Q_{2a}$ source current to a value greater than $I_{DSS}$. When $Q_{1a}$ drain goes high, $Q_{2a}$ gate is pushed up by the gate-source capacitance of $Q_{2a}$ thereby keeping $Q_{2a}$ source current high. The effect of bootstrapping is to increase both the speed of operation and power consumption of the gate, the power delay product remaining approximately the same.

What is claimed is:

1. A logic cell using depletion-MESFETs, the cell comprising:
   a driver section, a voltage level shifting section series connected to an output of the driver section, and a coupling capacitor connected in shunt with the voltage level shifting section;
   the driver section implemented as an array of depletion-MESFETs and having a switching section and a timing section, the timing section having a higher switching speed than that of the switching section;
   the switching section operable in response to a logic input level to give a corresponding logic output level to the voltage level shifting section;
   the timing section operable to control the switching section so that during the period of a logic swing in a first direction current flows from the coupling capacitor to a low reference voltage point, and during the period of a logic swing in the opposite direction current flows from a high reference voltage point to the coupling capacitor.

2. A logic cell as claimed in claim 1 in which said switching section comprises a pair of depletion-MES- FETs series conected between the high reference voltage point and the low reference voltage point, the driver section output being taken from the junction between the two depletion-MESFETs.

3. A logic cell as claimed in claim 2 in which the timing section comprises a further pair of depletion-MESFETs series connected between the high and low reference voltage points, a logic input being applied commonly to gates of the depletion-MESFETs connected to the low reference voltage, the gates of the depletion-MESFETs connected to the high reference voltage point being connected to the source of that timing section depletion-MESFET connected to the high reference voltage point.

4. A logic cell as claimed in claim 3 wherein the depletion-MESFETs connected to the low reference voltage point comprise a single split-gate device.

5. A logic cell as claimed in claim 3 wherein the depletion-MESFETs connected to the high reference voltage point comprise a single split-gate device.

6. A logic cell as claimed in claim 3 wherein the timing section that is connected to the high reference voltage point has its source connected to the switching section depletion-MESFET connected to the high reference voltage point and has its gate connected to the source and gate of a further depletion-MESFET, the further depletion-MESFET having its drain connected to the high reference voltage point.

* * * * *